(12) United States Patent
Ise

(10) Patent No.: US 11,838,671 B2
(45) Date of Patent: Dec. 5, 2023

(54) PHOTOELECTRIC CONVERSION APPARATUS FOR DETECTING LUMINANCE CHANGE, CONTROL METHOD OF PHOTOELECTRIC CONVERSION APPARATUS, PROGRAM STORAGE MEDIUM, AND IMAGE CAPTURING APPARATUS

(71) Applicant: CANON KABUSHIKI KAISHA, Tokyo (JP)

(72) Inventor: Yasuaki Ise, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/166,748

(22) Filed: Feb. 9, 2023

(65) Prior Publication Data

US 2023/0262360 A1   Aug. 17, 2023

(30) Foreign Application Priority Data

Feb. 15, 2022   (JP) .................................. 2022-021226

(51) Int. Cl.
*H04N 25/773* (2023.01)
*H01L 31/02* (2006.01)
(Continued)

(52) U.S. Cl.
CPC ......... *H04N 25/773* (2023.01); *H04N 25/767* (2023.01); *H04N 25/7795* (2023.01); *H04N 25/78* (2023.01); *H01L 31/02027* (2013.01)

(58) Field of Classification Search
CPC ............... H04N 25/773; H04N 25/767; H04N 25/7795; H04N 25/78; H04N 25/47; H04N 25/707; H01L 31/02027
(Continued)

(56) References Cited

U.S. PATENT DOCUMENTS 9,210,350 B2    12/2015  Dai et al.
2011/0080510 A1*  4/2011  Nishihara ............... H04N 25/57
                                                      348/308
(Continued)

FOREIGN PATENT DOCUMENTS

JP      2019-134271 A    8/2019

*Primary Examiner* — Georgia Y Epps
*Assistant Examiner* — Mai Thi Ngoc Tran
(74) *Attorney, Agent, or Firm* — Cowan, Liebowitz & Latman, P.C.

(57) ABSTRACT

A photoelectric conversion apparatus and the like that enables a predetermined determination in response to the incidence of photons is provided. The photoelectric conversion apparatus comprising a pixel provided with a photoelectric conversion unit that outputs a signal in response to the incidence of a photon; and a plurality of processing units configured to correspond to the pixel, wherein the processing unit has a first counter circuit configured to count an output signal from the pixel during a predetermined time period and a first memory configured to store a count value counted by the first counter circuit as a second count value, and wherein the processing unit outputs a determination result obtained by comparing a first count value output by the first counter circuit and a predetermined threshold that has been set based on the second count value read out from the first memory.

15 Claims, 14 Drawing Sheets

(51) Int. Cl.
*H04N 25/76* (2023.01)
*H04N 25/78* (2023.01)
*H04N 25/767* (2023.01)

(58) Field of Classification Search
USPC .......................................... 250/208.1, 214 R
See application file for complete search history.

(56) References Cited

U.S. PATENT DOCUMENTS

2015/0163429 A1* 6/2015 Dai ...................... H04N 25/581
348/295
2020/0351455 A1 11/2020 Niwa \* cited by examiner

PHOTOELECTRIC CONVERSION APPARATUS FOR DETECTING LUMINANCE CHANGE, CONTROL METHOD OF PHOTOELECTRIC CONVERSION APPARATUS, PROGRAM STORAGE MEDIUM, AND IMAGE CAPTURING APPARATUS

BACKGROUND OF THE INVENTION

Field of the Invention

The present invention relates to a photoelectric conversion apparatus, a control method of the photoelectric conversion apparatus, a program storage medium, and an image sensor.

Description of the Related Art

A photoelectric conversion apparatus that digitally counts the number of photons arriving at an avalanche photodiode (hereinafter, referred to as an "APD") and outputs the count value from the pixel as a photoelectrically converted digital signal (hereinafter, referred to as a "photon counting type sensor") is known. Such a photoelectric conversion apparatus is disclosed, for example, in U.S. Pat. No. 9,210,350. The photoelectric conversion apparatus disclosed in U.S. Pat. No. 9,210,350 counts the time of arrival of photons at the APD in addition to the number of photons arriving at the APD, and outputs both information regarding the number of photons and the counted time.

In contrast, there is an event-based sensor that outputs the luminance level change of each pixel (pixel address) as an address event signal in real time so that high-speed processing is realized. In Japanese Patent Laid-Open No. 2019-134271, an asynchronous photoelectric conversion apparatus (hereinafter, referred to as a "DVS" (Dynamic Vision Sensor)) is disclosed as such an event-based sensor.

SUMMARY OF THE INVENTION

However, it is impossible to obtain a photoelectric conversion apparatus that enables performing a predetermined determination in response to the incidence of photons in the configuration disclosed in the U.S. patent publication No. 9210350 and Japanese Patent Laid-Open No. 2019-134271.

An object of the present invention is to provide a photoelectric conversion apparatus and the like that enables performing a predetermined determination in response to the incidence of photons.

The photoelectric conversion apparatus as an aspect of the invention comprises:
   a pixel provided with a photoelectric conversion unit that outputs a signal in response to the incidence of a photon; and a plurality of processing units configured to correspond to the pixel, wherein the processing unit has a first counter circuit configured to count an output signal from the pixel during a predetermined time period and a first memory configured to store a count value counted by the first counter circuit as a second count value, and wherein the processing unit outputs a determination result obtained by comparing a first count value output by the first counter circuit and a predetermined threshold that has been set based on the second count value read out from the first memory.

Further features of the present invention will become apparent from the following description of exemplary embodiments with reference to the attached drawings.

DESCRIPTION OF THE EMBODIMENTS

The embodiments for carrying out the present invention will be described in detail below. Note that the embodiment to be described below is an example for realizing the present invention and should be modified or adjusted as appropriate according to the configuration of the device and various conditions to which the present invention is applied, and the present invention is not limited to the following embodiments. Additionally, the same number is given to those having the same function in all the drawings, and the repeated explanation will be omitted.

First Embodiment (Image Capturing Apparatus)

Figure 1:
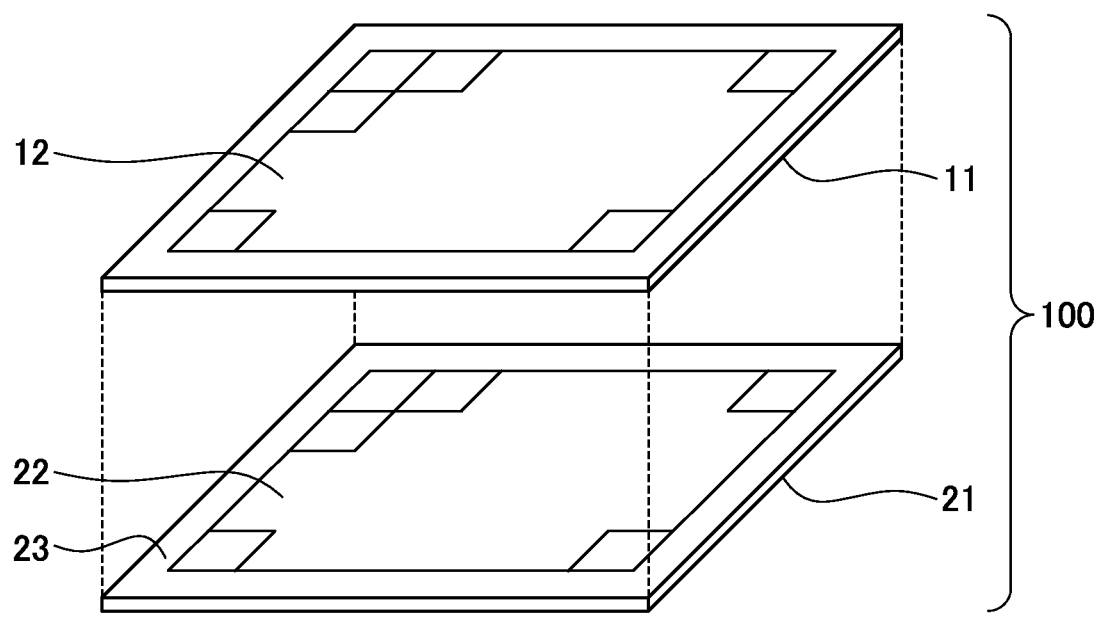
FIG. 1 shows an example of a configuration of the photoelectric conversion apparatus of the image capturing apparatus according to the first embodiment.

FIG. 1 is a diagram showing a configuration example of a photoelectric conversion apparatus 100 of an image capturing apparatus according to an embodiment. The image capturing apparatus according to the first embodiment has an imaging optical system that includes the photoelectric conversion apparatus 100 and an image formation optical system (not illustrated). The photoelectric conversion apparatus 100 is configured by laminating and electrically connecting two chips of a sensor substrate 11 and a circuit substrate 21. The sensor substrate 11 includes a pixel region 12. Note that, although the imaging optical system is configured by a plurality of lenses and holding members (not illustrated), the present invention is not limited thereto, and the imaging optical system may be configured so as to have a motor for driving the lens and to enable adjusting a zoom magnification and a focus position.

The circuit substrate 21 includes a pixel circuit region 22 in which signals detected in the pixel region 12 are processed, and a readout circuit region 23 for reading out signals from the pixel circuit region 22. Note that, although, in the first embodiment, it is assumed that a laminated structure is provided, and a single layer structure may be provided if it has a similar function.

(Pixel Substrate)

Figure 2A:
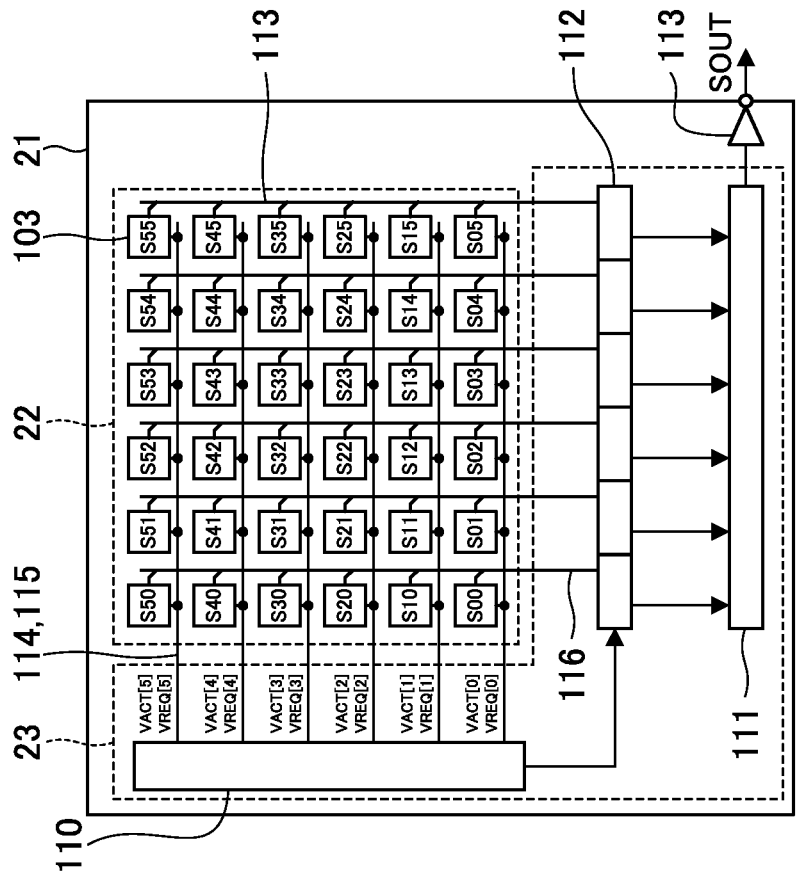
FIG. 2A and FIG. 2B are diagrams showing examples of a substrate configuration in the photoelectric conversion apparatus according to the first embodiment.
Figure 2B:
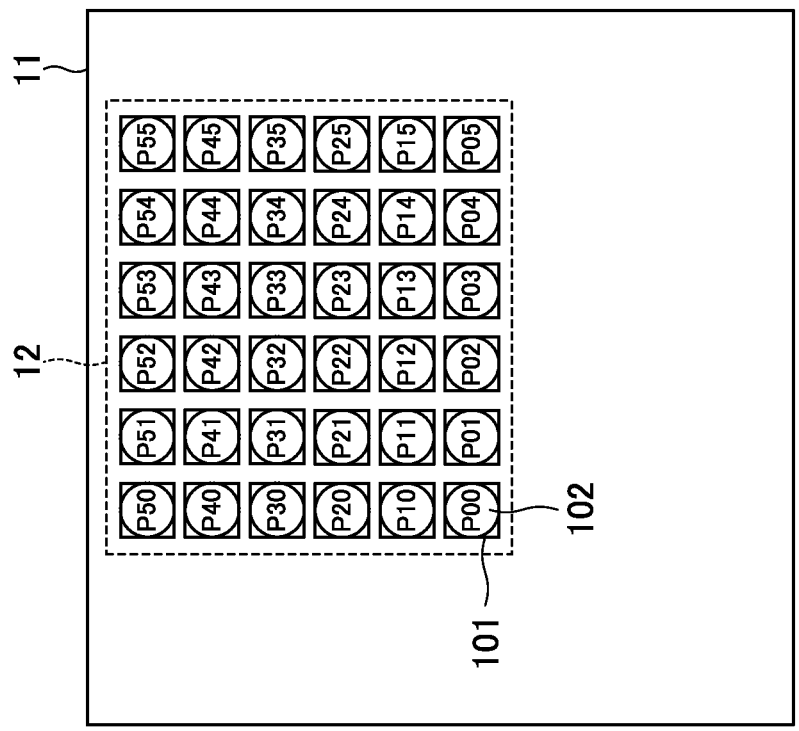

FIG. 2A and FIG. 2B are diagrams showing examples of substrate configurations in the photoelectric conversion apparatus 100 of the first embodiment. FIG. 2A is a diagram showing an example of a configuration of the sensor substrate 11.

The pixel region 12 of the sensor substrate 11 includes a plurality of pixels 101 that are two-dimensionally arranged. The pixel 101 is provided with a photoelectric conversion unit 102 that includes an avalanche photodiode (APD). In FIG. 2A, 36 pixels 101 that are arranged in six rows from the 0th row to the fifth row and in sixth columns from the 0th column to the fifth column are shown by reference numerals that indicate the row number and the column number. For example, the reference numerals of "P14" is given to the unit pixel of the sensor substrate 11, which is disposed in the first row and the fourth column. Note that the reference letter is used as an example, and, the number of rows and columns of the pixel array forming the pixel region 12 is not particularly limited.

(Circuit Substrate)

FIG. 2B is a diagram showing an example of a configuration of the circuit substrate 21. The circuit substrate 21 includes the pixel circuit region 22 and the readout circuit region 23.

The pixel circuit region 22 includes a plurality of signal processing units (signal processing circuits) 103 that are two-dimensionally arranged, corresponding to each of the pixels 101 of the sensor substrate 11. In FIG. 2B, 36 signal processing units 103 that are arranged in the six rows from the 0th row to the fifth row and in the six columns from the 0th column to the fifth column are shown by reference letters that indicate the row number and the column number. For example, the reference letter of "S14" is given to the signal processing units 103 arranged in the first row and the fourth column. Note that, in particular, the number of rows and columns of the signal processing unit array that forms the pixel circuit region 22 is not limited.

The readout circuit region 23 includes a vertical arbitration circuit 110, a horizontal readout circuit 111, column circuits 112, and a signal output circuit 113.

(Vertical Arbitration Circuit)

In each row of the signal processing unit array of the pixel circuit region 22, a request signal output line 114 VREQ and a response input line 115 VACT are arranged to extend in the first direction (horizontal direction in FIG. 2B). The request signal output line 114 VREQ and the response input line 115 VACT are respectively connected to the signal processing units 103 arranged in the first direction, and form a signal line (control line). There is a case in which the first direction in which the request signal output line 114 VREQ and the response input line 115 VACT extend are referred to as a "row direction" or a "horizontal direction". Note that, in FIG. 2B, the request signal lines VREQ and VACT are shown by reference letters that indicate row numbers. For example, the reference letter of "VREQ [1]" is given to the request signal line in the first row.

The request signal lines VREQ and VACT in each row are connected to the vertical arbitration circuit 110. The vertical arbitration circuit 110 supplies control signals for driving the signal processing unit 103 to the signal processing unit 103 via the request signal output line 114 VREQ and the response input line 115 VACT.

The signal processing unit 103 outputs a request signal that requests the output of address event data (event determination result), which is information regarding luminance level change, to a vertical arbitration circuit 110 via a request signal output line 114 VREQ.

In the vertical arbitration circuit 110, a request from the signal processing unit 103 of each pixel is arbitrated, and a response indicating whether or not the output of address event data is permitted is returned to the signal processing unit 103 via the response input line 115 VACT.

(Signal Output)

In each row of the signal processing unit array in the pixel circuit region 22, signal lines 116 are arranged to extend in a second direction (longitudinal direction in FIG. 2B) that crosses the first direction.

The signal lines 116 are respectively connected to the signal processing units 103 arranged in the second direction to form shared signal lines. There is a case in which the second direction in which the signal lines 116 extend is referred to as a column direction or a vertical direction.

Upon receiving a permission response of the output from the vertical arbitration circuit 110, each of the signal processing units 103 outputs the address event data from the signal processing unit 103 to the column circuit 112 via the signal line 116.

The column circuits 112 are respectively provided to correspond to each column of the signal processing unit array in the pixel circuit region 22 and connected to the signal lines 116 of the corresponding column. In the column circuit 112, a latch function for holding the signal read out from the signal processing unit 103 via the signal line 116 of the corresponding column is provided.

(Horizontal Readout)

The horizontal readout circuit 111 supplies a control signal for reading out the signals from the column circuit 112 to the column circuit 112, and receives address event data from the column circuit 112 of each column.

The signal output circuit 113 outputs the address event data that have been measured at each pixel as a signal output SOUT.

The address event data includes the coordinate information of the unit pixel in which the change in the number of incident photons per unit time as an event has occurred, and the information regarding the time when the change in the number of incidence photons per unit time has occurred. In addition, the polarity (positive or negative) of the change in the number of incident photons per unit time can be included.

The counting method of address event data will be described below.

(Functional Configuration)

Figure 3:
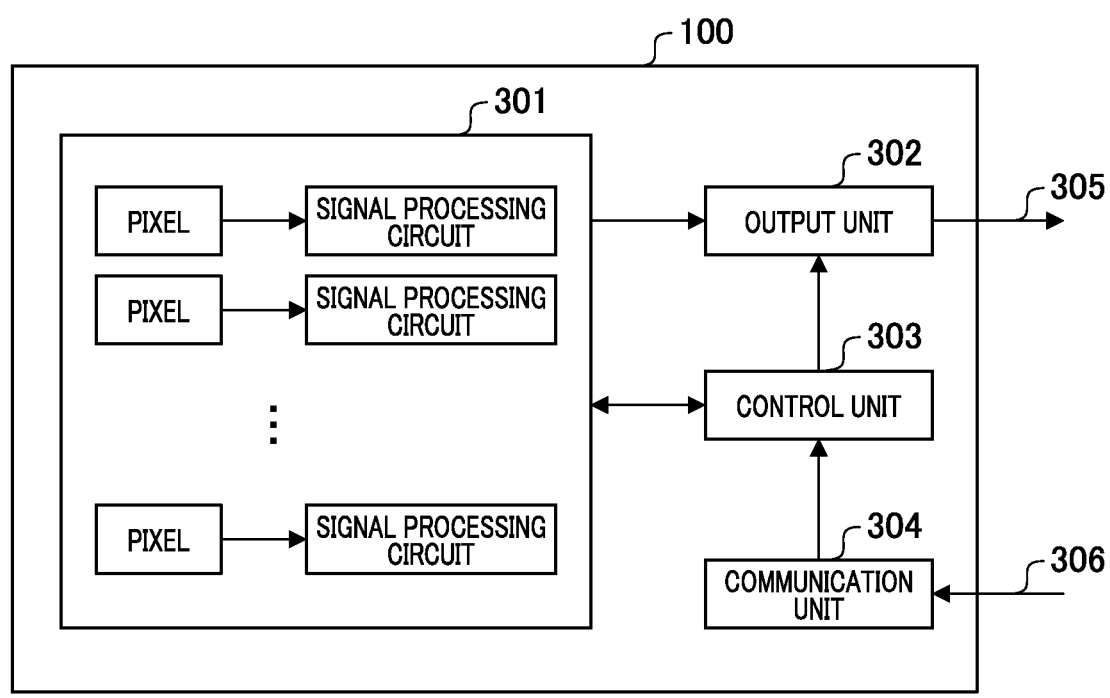
FIG. 3 is a block diagram showing the function of the photoelectric conversion apparatus according to the first embodiment.

FIG. 3 illustrates an example of a functional configuration of the photoelectric conversion apparatus 100 of the first embodiment. The photoelectric conversion apparatus 100 includes, as its functions, for example an image pickup unit (image capturing unit) 301, an output unit 302, a control unit 303, and a communication unit 304.

The image pickup unit 301 converts a photon of an object image into an imaged electrical signal. The image pickup unit 301 outputs the converted electrical signal to the output unit 302.

The output unit 302 outputs the electrical signal that has been output from the photoelectric conversion apparatus 100 to an external module as a signal output 305.

The control unit 303 includes a CPU, a memory (storage medium) and the like, is configured by at least one computer, and connected to each component of the photoelectric conversion apparatus 100 via a line. The control unit 303 also functions as a processing unit that comprehensively controls the driving and the like of each component of the entire photoelectric conversion apparatus 100, according to a program stored in the memory. The control unit 303 also generates and changes a control cycle for generating an internal CLK (clock) that drives the signal processing unit 103 and counting photons. The control unit 303 also switches the driving method of the image pickup unit 301 according to a control input 306 from the external module. Furthermore, the control unit 303 may be configured to determine the occurrence of the address event from the image pickup unit 301 and switch the driving method of the image pickup unit 301.

The communication unit 304 is an interface unit that performs communication with an external module and receives the control input 306 for driving the photoelectric conversion apparatus.

(Pixel Portion)

Figure 4:
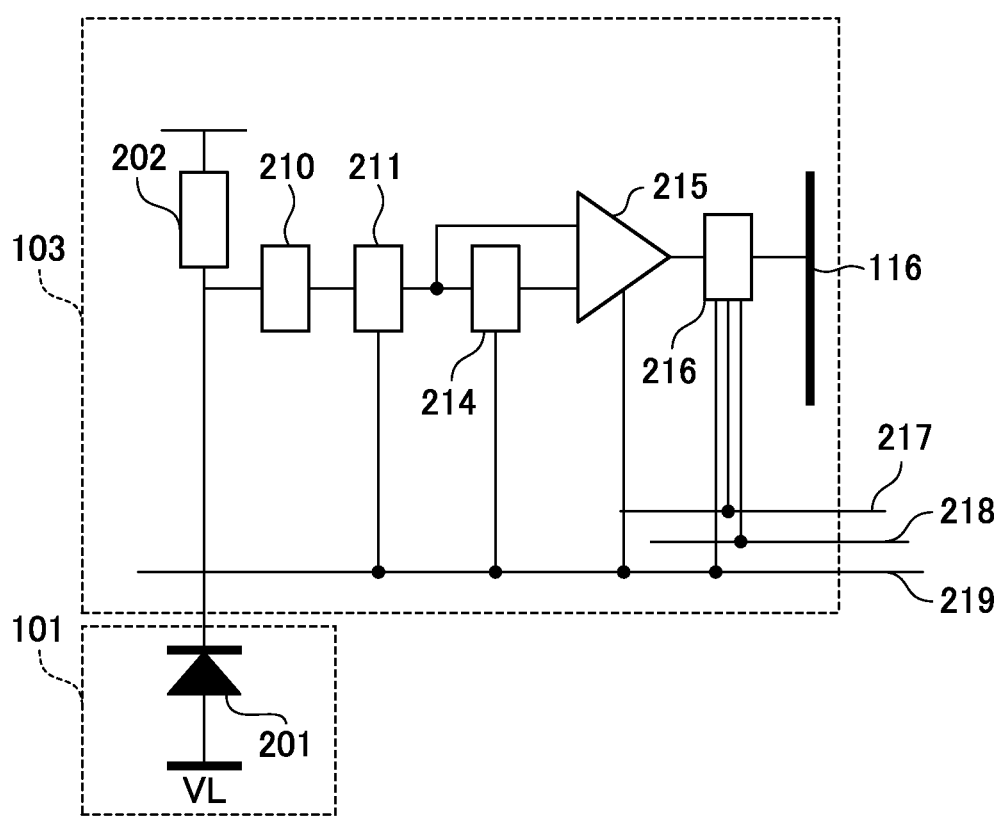
FIG. 4 is an example of the equivalent circuit and block diagram of a pixel and a signal processing unit according to the first embodiment.

FIG. 4 is a diagram showing an example of a configuration of a pixel portion according to the first embodiment. Specifically, an example of an equivalent circuit and block diagram of the pixel 101 and the signal processing unit 103 of the photoelectric conversion apparatus 100 is shown. Note that, in the first embodiment, the pixel portion includes the pixel 101 and the signal processing unit 103.

The pixel 101 in the sensor substrate 11 includes an APD 201 that is a photoelectric conversion unit. When light is incident to the APD 201, a charge pair according to the incident light is generated by photoelectric conversion. A voltage VL (first voltage) is supplied to an anode of the APD 201. A voltage VH (second voltage), which is higher than the voltage VL supplied to the anode, is supplied to the cathode of the APD 201 through a quench element 202. A reverse bias voltage such that the APD 201 performs avalanche multiplication operation is supplied to the anode and the cathode through the quench element 202. In a state in which such a voltage is supplied, the charge generated due to the incident light causes avalanche multiplication and an avalanche current is generated.

The signal processing unit 103 in the sensor substrate 11 includes the quench element 202, a waveform shaping unit 210, a counter circuit 211, a memory 214, a comparison circuit 215, a determination circuit (event detection circuit) 216, a response line 217, a selection line 218, and a control line 219.

The quench element 202 is connected to a power supply that supplies the voltage VH and the APD 201. The quench element 202 has the function for replacing the change in the avalanche current caused at the APD 201 with a voltage signal. The quench element 202 functions as a load circuit (quench circuit) during signal multiplication due to avalanche multiplication and has the function of suppressing the avalanche multiplication by suppressing the voltage supplied to the APD 201 (quenching operation).

The waveform shaping unit 210 shapes the electric potential change of the cathode of the APD 201 obtained during photon detection and outputs a pulse signal. For example, an inverter circuit and a buffer circuit are used for the waveform shaping unit 210.

(Pixel Counter Unit)

The counter circuit 211 counts pulse signals (output signals from the pixel) that are output from the waveform shaping unit 210. That is, the counter circuit 211 is a counter circuit that counts the number of photons incident to each of the APDs. Additionally, the counter circuit 211 starts the counting operation, stops the counting operation, and resets the count value (counter value) N upon receipt of the control signal from the control unit 303 via the control line 219. The count operation is performed at an arbitrary cycle based on the control signal.

The reset cycle of the counter circuit is preferably set in a shorter period when, for example, a moving image is captured at a frame rate of 60 fps. Hereinafter, a time-period during which image capturing is performed in units of frame images is referred to as a "frame time period". Furthermore, a counter operating period for comparing the occurrence of address event is referred to as a "sub-frame period". It is desirable that the sub-frame period can be appropriately changed according to the illuminance of the object. For example, it is preferable that a short time is set in a sufficiently bright environment and a long time is set in an extremely dark environment.

The memory 214 is a storage medium that stores count values counted. The count value (counter value) M of the counter circuit 211 last time is stored in the memory 214, and a new count value M is overwritten on the count value M last time upon the count stop of the counter circuit 211.

In the comparison circuit 215, the output value of the counter circuit 211 is compared to the threshold Nth. The threshold Nth consists of the first threshold Nth1 and the second threshold Nth2 that is generated with a numerical value higher than the first threshold Nth1 and is generated based on the count value M held in the memory 214. For example, when "4" is set as the event detection threshold range while the count value M last time is "13", Nth1=12 and Nth2=16 are set. This threshold Nth1 is set to the value obtained by rounding down the count value N=13 last time by two lower bits, according to the fact that the detection threshold range is 4, that is, it is a set value range of two bits. Additionally, the first threshold Nth2 is the value obtained by adding the event detection threshold range 4 to the first threshold Nth1. The event detection threshold range can be set by, for example, a complement of 2, and is configured to be changeable for each pixel 101 according to an instruction from the control unit 303. Note that the above explanation is an example, and a configuration in which the event detection threshold range can be set by an arbitrary value may be adopted.

The determination circuit 216 determines the presence or absence of the occurrence of events based on the output signals of the comparison circuit 215. Address event data are denoted by "−1" if, for example, the value is less than the second threshold Nth2 and the first threshold Nth1 (less than the first threshold and less than the second threshold). Furthermore, the address event data are denoted by "+1" if, for example, the value is higher than the first threshold Nth1 and the second threshold Nth2 (equal to or higher than the first threshold and equal to or higher than the second threshold). Furthermore, the address event data are denoted by "0" if the value is higher than the first threshold Nth1 and less than the second threshold Nth2 (higher than or equal to the first threshold and less than the second threshold).

(Cooperation with Peripheral Circuits)

When the address event data are "−1" or "+1", the determination circuit 216 transmits a request signal to the vertical arbitration circuit 110 via the request signal output line 114 VREQ. In contrast, the determination circuit 216 does not transmit the request signal when the address event data are "0".

The response line 217 receives a response indicating permission or non-permission for output of the address event data from the vertical arbitration circuit 110 via the response input line 115 VACT. When the response line 217 receives a response indicating the permission for output, the determination circuit 216 outputs the address event data to the column circuit 112 via the signal line 116. In contrast, when the response line 217 receives a response indicating the non-permission for output, the determination circuit 216 does not output the address event data to the column circuit 112.

The selection line 218 is a circuit that switches the output data of the signal processing unit 103. The control line 219 is connected to the counter circuit 211, the memory 214, the comparison circuit 215, and the determination circuit 216. The control line 219 is, for example, a line that transmits a control signal from the control unit 303 to any of the circuits or memories being connected.

The comparison circuit 215 compares the first threshold Nth1 and the second threshold Nth2 based on the count value M (second count value) held in the memory 214 and the count value N (first count value) counted by the counter circuit 211. Consequently, it is possible to detect changes in the number of incident photons per unit time. The count value M held in the memory 214 is the count value counted by the counter circuit 211 one before (immediately before) the count value N counted by the counter circuit 211. Accordingly, the photoelectric conversion apparatus 100 in the first embodiment has a function for measuring the change in the frequency of incidence of photons, that is, the luminance level change.

Furthermore, address events are output only when the difference in the number of incident photons is equal to or higher than a predetermined threshold range defined as the event detection threshold range. It is possible to realize a photoelectric conversion apparatus that detects the luminance level change for each pixel address as an address event in real time by adopting the configuration of the photoelectric conversion apparatus 100 in the first embodiment as described above.

(Timing Chart: Photon Count)

Figure 5:
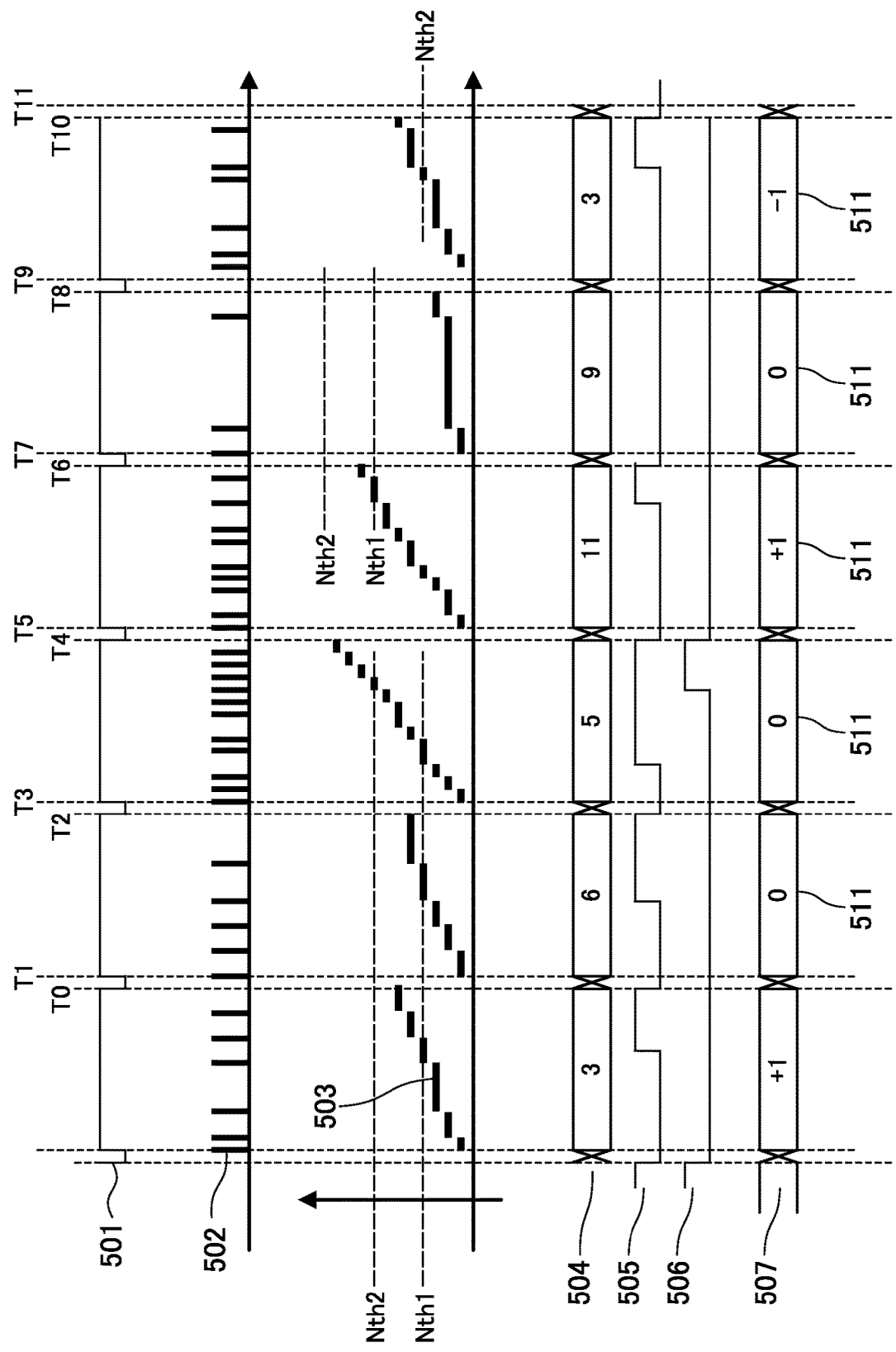
FIG. 5 is a diagram showing a timing chart that explains a driving method of the photoelectric conversion apparatus according to the first embodiment.

FIG. 5 illustrates an example of a timing chart that explains a driving method for detecting an address event by using the photoelectric conversion apparatus 100.

Here, FIG. 5 shows a case in which the event detection threshold range is 4, as an example. A signal 501 is a control signal that controls the sub-frame period. A signal 502 is a pulse signal in which a photon has been detected by the counter circuit. A signal 503 indicates the count value N that is the count value of the counter circuit. A signal 504 shows the count value M (second count value) held (recorded) in the memory 214. The signal 505 and a signal 506 are the output signals of the comparison circuit 215. A signal 507 indicates the event determination value E in the determination circuit 216. A signal 511 indicates the event detection value for each sub-frame period. "T" in FIG. 5 indicates time.

Times T1, T3, T5, T7, T9, and T11 indicate the start timing of each of the sub-frame periods. Times T2, T4, T6, T8, and T10 indicate the end timing of each of the sub-frame periods. The counter circuit 211 starts the counting of photons at the timing when the signal 501 becomes High and ends the counting at the timing when the signal becomes Low. After the count value M of the memory 214 is updated, the counter circuit 211 is reset.

In the comparison circuit 215, the signal 505 is set to High at the timing of the count value N≥first threshold Nth1 and the signal 506 is set to High at the timing of the count value N≥second threshold Nth2. The signal 505 and the signal 506 are reset and turned to Low with the end of the sub-frame period.

First, at time T0, the number of photons counted by the counter circuit 211 during the sub-frame period before time T0 is assumed as the count value M and held in the memory 214. At this time, since the number of counted photons is 6 as shown in FIG. 5 is assumed as the count value M and held in the memory 214. The count value M of the memory 214 held last time is updated by holding a new count value M in the memory 214 and the count value M is overwritten. Subsequently, the counter circuit 211 is reset.

Next, at time T1, the counter circuit 211 starts counting of photons anew. Here, in the comparison circuit 215, the first threshold Nth1=4 and the second threshold Nth2=8 are set as thresholds based on the count value M=6 that is currently held in the memory 214. The counting of photons starts at time T1 and ends at time T2. The number of photons counted from time T1 to time T2 is the count value N=5 at time T2.

Here, during time T1 to time T2, the number of photons=5 counted by the counter circuit 211 is assumed as the count value M=5 and held in the memory 214. The count value M of the memory 214 held at T0 is updated by holding a new count value M in the memory 214 and the count value M is overwritten. Subsequently, the counter circuit 211 is reset.

Note that the comparison circuit 215 sequentially compares the count value N with the first threshold Nth1 and the second threshold Nth2 during the sub-frame period during time T1 to time T2. At this time, since the first threshold Nth1 is 4 and the second threshold Nth2 is 8, the count value N≥the first threshold Nth1 is established when the count value N reaches 4. Thus, the comparison circuit 215 sets the signal 505 to High at some point in time from T1 to T2. However, since the count value N is finally N=5, the second threshold Nth2>count value N is established and the signal 506 remains Low. Consequently, the event detection threshold in the next sub-frames T3 to T4 is not updated. That is, the determination circuit 216 receives the signal 505 and the signal 506 from the comparison circuit 215, determines the event determination value E=0, and the signal 507 becomes 0 during time T1 to T2. Here, since the event determination value E is "0", the determination circuit 216 does not transmit a request signal to the vertical arbitration circuit 110.

Note that, at time T3, the counter circuit 211 starts counting of photons anew. Here, in the comparison circuit 215, the first threshold Nth1=4 and the second threshold Nth2=8 are set as thresholds based on the count value M=5 held in the memory 214 at the time of time T2. The counting of photons starts at time T3 and ends at time T4. The number of counted photons from time T3 to time T4 is finally 11 as shown in FIG. 5. Therefore, the count value N=11 during the sub-frame period from time T1 to time T2 is assumed.

Here, during time T3 and time T4, the number of photons counted by the counter circuit 211=11 is assumed as the count value M=11 and held in the memory 214. The count value M in the memory 214 held at T2 is updated by holding a new count value M in the memory and the count value M is overwritten. Subsequently, the counter circuit 211 is reset.

Note that the comparison circuit 215 sequentially compares the count value N with the first threshold Nth1 and the second threshold Nth2 during the sub-frame period from time T3 to time T4. At this time, since the first threshold Nth1 is 4 and the second threshold Nth2 is 8, the count value N≥the first threshold Nth1 is established when the count value N reaches 4, and the signal 505 becomes High. Additionally, when the count value N reaches 8, the count value N≥the second threshold Nth2 is established, and the signal 506 becomes High.

When determining that each of the signal 505 and the signal 506 is High, the determination circuit 216 determines the event determination value E=+1, and +1 is applied to the signal 507 during T5 to T6. Here, since the event determination value E is "+1", the determination circuit 216 transmits a request signal for outputting the event determination value E to the vertical arbitration circuit 110. Then, the determination circuit 216 outputs the event determination value E to the column circuit 112 upon receiving the response signal from the vertical arbitration circuit 110.

At time T5, the thresholds are respectively updated so as to obtain the first threshold Nth1=8 and the second threshold Nth2=12 based on the count value M of the memory 214 updated at time T4. After updating, the counter circuit 211 starts counting of photons anew. The counting of photons starts at time T5 and ends at time T6. The number of counted photons during time T5 to time T6 finally is 9 as shown in FIG. 5. Therefore, the count value N=9 during the sub-frame period from time T5 to time T6 is assumed.

During time T5 to time T6, the number of photons counted by the counter circuit 211 is held as the count value M=9 in the memory 214. The count value M of the memory 214 held until T4 is updated by holding a new count value M in the memory 214 and the count value M is overwritten. Subsequently, the counter circuit 211 is reset.

Note that the comparison circuit 215 sequentially compares the count value N with the first threshold Nth1 and the second threshold Nth2 during the sub-frame period from time T5 to time T6. At this time, since the first threshold Nth1 is 8 and the second threshold Nth2 is 12, the count value N≥the first threshold Nth1 is satisfied when the count value N reaches 8, and the signal 505 becomes High. In contrast, since the count value N is finally 9, the second threshold Nth2>the count value N is satisfied and the signal 506 remains Low. Consequently, the event detection threshold for the next sub-frame is not updated. The determination circuit 216 receives the signals 505 and 506 from the comparison circuit 215, determines that event determination value E=0, and signal 507 becomes 0 during the time T7 to T8. Here, since the event determination value E is "0", the determination circuit 216 does not transmit a request signal to the vertical arbitration circuit 110.

Subsequently, at time T7, the counter circuit 211 starts counting photons anew. Here, in the comparison circuit 215, the first threshold Nth1=8 and the second threshold Nth2=12 are set to be thresholds based on the count value M=9 held in the memory 214 at time T6. The counting of photons starts at time T7 and ends at time T8. The number of counted photons during time T7 to time T8 is finally 3 as shown in FIG. 5. Therefore, the count value N=3 at time T8 is set.

The number of counted photons counted by the counter circuit 211 is assumed as the count value M=3 and held in the memory 214. The count value M of the memory 214 held until T6 is updated by holding a new count value M in the memory 214 and the count value M is overwritten. Subsequently, the counter circuit 211 is reset.

Note that the comparison circuit 215 sequentially compares the count value N to the first threshold Nth1 and the second threshold Nth2 during the sub-frame period from time T7 to time T8. At this time, since the first threshold Nth1 is 8 and the second threshold Nth2 is 12, the first threshold Nth1>count value N and the second threshold Nth2>count value N become are established until time T8, and both the signal 505 and the signal 506 remain Low.

The determination circuit 216 determines that the event determination value E=−1 since the signal 505 and the signal 506 are respectively Low, and the signal 507 becomes −1 during time T9 to T10. In this case, since the event determination value E is "−1", the determination circuit 216 transmits a request signal for outputting the event determination value E to the vertical arbitration circuit 110. Then, the determination circuit 216 outputs the event determination value E to the column circuit 112 upon receiving the response signal from the vertical arbitration circuit 110.

Subsequently, the same processing is performed at time T9 and subsequent time, and the signal processing unit 103 repeats the above operations.

(Advantages in Photon Counting)

As described above, the photoelectric conversion apparatus 100 in the first embodiment counts the number of photons and compares the count value N that is the count value of the photons and a predetermined event detection threshold calculated based on and the count value M stored in the memory 214. Thus, the photoelectric conversion apparatus 100 can measure the luminance level change. Furthermore, the photoelectric conversion apparatus 100 in the first embodiment can detect the luminance level change at the level of one photon. Specifically, the photoelectric conversion apparatus 100 can detect the luminance level change at the level of one photon by setting the event detection threshold range to 1.

Additionally, in the photoelectric conversion apparatus 100 in the first embodiment, since the detection conditions of address event can be set by digital signals according to the threshold of the comparison circuit, the detection conditions of address event can be more precisely set than those of a general photoelectric conversion apparatus.

(Timing Chart: Change of Subframe Time Period)

Figure 6A:
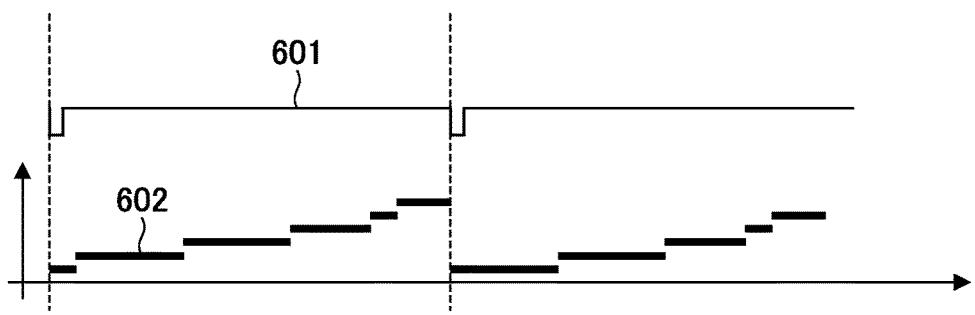
FIG. 6A to FIG. 6C are diagrams that show a change method of a sub-frame period in the timing chart that explains the driving method of the photoelectric conversion apparatus according to the first embodiment.
Figure 6B:
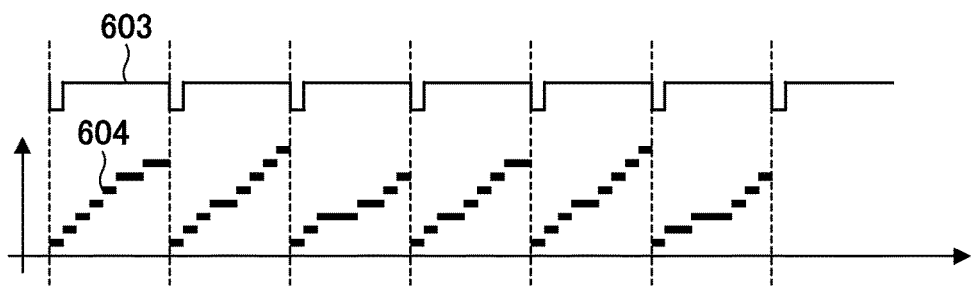
Figure 6C:
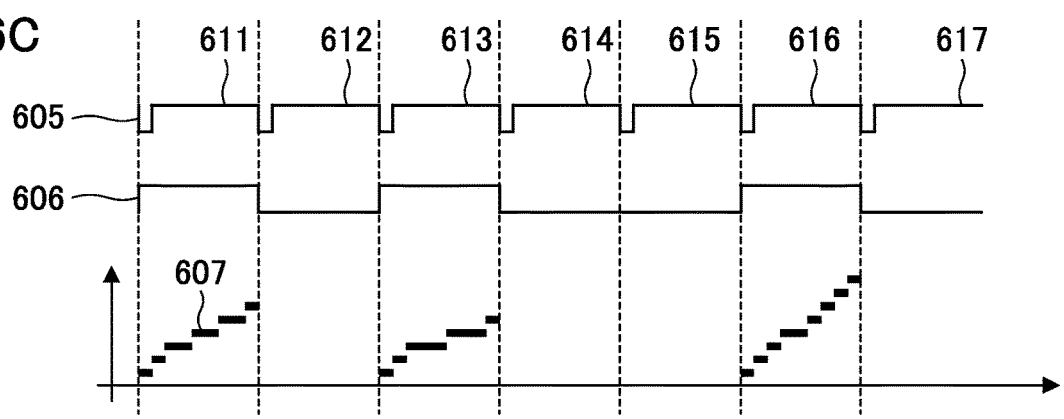

FIG. 6A to 6C illustrate an example of a driving method for changing the time of the sub-frame period. In FIG. 6A, a count value of photons in the counter circuit 211 in an extremely dark environment is shown. A control signal 601 indicates the sub-frame period set by the control unit 303. A signal 602 is the count value N in the counter circuit 211. In FIG. 6B, a count value 604 of the photons in the counter circuit 211 in a brighter environment than that in FIG. 6A is shown. In FIG. 6C, the operation in the counter circuit 211 in the environment where the brightness is the same as that in FIG. 6B is shown.

In FIG. 6B, a control signal 603 is a control signal in which the sub-frame period is shorter than that of the control signal 601. Since an amount of incident photons increases or decreases depending on the brightness of the environment, the count value becomes extremely high in a bright environment. Therefore, in order to prevent saturation of the count value, the number of bits in the counter needs to be increased. To take a countermeasure against this, the number of photons per unit time is reduced by shortening the sub-frame period by the control signal 603 from the control unit 303, and the upper limit of the count value can thereby be set lower.

In contrast, when the sub-frame period is shortened, the number of detection times of address event increases. To take a countermeasure against this, the control unit 303 adjusts the number of detection times of address event by thinning out the determination time-period of address event, as illustrated in FIG. 6C.

In FIG. 6C, a control signal 605 is a control signal that sets the sub-frame period. A configuration in which a new control signal 606 that controls the driving of the counter circuit 211 is added to the control line 219, with respect to the setting of the sub-frame period, is shown. For example, the control unit 303 controls the counter circuit 211 in a manner such that the counting is performed only when the control signal 606 is High so that the determination period of address events is thinned out. The control unit 303 can set a sub-frame period for causing discretely operating the counter circuit 211 as in the sub-frame periods 611, 613, and 616. By doing so, the number of detection times of address can be reduced.

The control unit 303 can also change the timing of driving the counter circuit 211, in addition to controlling setting and changing and the like of the sub-frame period, according to the amount of incident light as described above. The timing for driving the counter circuit 211 can be set at an arbitrary timing. The timing for driving the counter circuit 211 may be set to be shared for all pixels, or the configuration in which the timing can be set for each pixel or pixel region may be adopted. In this case, although the frequency of the determination of the address event was reduced by the control unit 303 causing the counter circuit 211 to stop, the control unit 303 may cause the determination circuit 216 to stop determination. Causing the determination circuit 216 to stop determination results in the same effect as in the case in which the counter circuit 211 is caused to stop.

The sub-frame period in which the control period of the counter circuit 211 is determined is set to a cycle shorter than a cycle of capturing a frame image in the case in which an image is captured at, for example, 60 fps. Additionally, it is desirable that the sub-frame period can be changed appropriately according to the illuminance of the object. For example, a short time is set in a sufficiently bright environment, and a long time is set in an extremely dark environment. This control depending on the brightness may be controlled by the control unit 303 disposed inside the photoelectric conversion apparatus 100 or may be controlled based on a control input from an external device that has received a sensor output.

Additionally, it is preferable that the event determination threshold range is lower because the frequency of determining the presence or absence of a change in the count value N is higher and the luminance level change can be captured instantaneously. In contrast, it is preferable that the event determination threshold range is greater because the frequency of incidence of photons is estimated with many photons, the estimation accuracy increases, and thereby the luminance level change can be measured correctly. In the first embodiment, the configuration in which the event determination threshold can be changed appropriately is adopted, as described above. Therefore, it is possible to capture the luminance level change appropriately depending on a use case and an object.

DVS has two main advantages. One is the capability to capture a high-speed phenomenon in a vehicle and the like, and the other one is the capability to reduce an amount of data by eliminating output when there is no luminance level change, such as in fixed-point monitoring in a parking place and the like. If, as in the former case, a high-speed phenomenon is desired to be captured, it is preferable that the event determination threshold range is set lower so that luminance level change can be captured instantaneously. In contrast, if, as in the latter case, output in the case in which there is no luminance level change is desired to be suppressed, it is preferable that the output in the case in which there is no luminance level change is reliably suppressed by setting the event determination threshold range greater and measuring the luminance level change correctly.

It is possible to control the number of detections of address events by controlling the sub-frame period according to the amount of incident light by using the photoelectric conversion apparatus 100 in the first embodiment, as described above. Additionally, it is possible to count the photons that are suitable for an external light condition by adopting the configuration in which the event detection threshold range and a control cycle of the sub-frame period can be changed.

Note that. in FIG. 2A and FIG. 2B, although the address events of each pixel are read out by using the vertical arbitration circuit and the horizontal readout circuit, another configuration may be adopted. More specifically, a three-layer structure in which a memory chip 31 is further added to the sensor board 11 and the circuit substrate 21 is adopted. Subsequently, a time count value measured at each pixel may be transferred to the memory chip for each pixel, stored temporarily in the memory in the memory chip, and sequentially output from the memory chip.

Second Embodiment

The photoelectric conversion apparatus 100 in the second embodiment is different from the photoelectric conversion apparatus 100 in the first embodiment in the configuration of a signal processing unit 701. The same reference letters are given to the configuration that is the same as that in the first embodiment and the descriptions thereof will be omitted.

Figure 7:
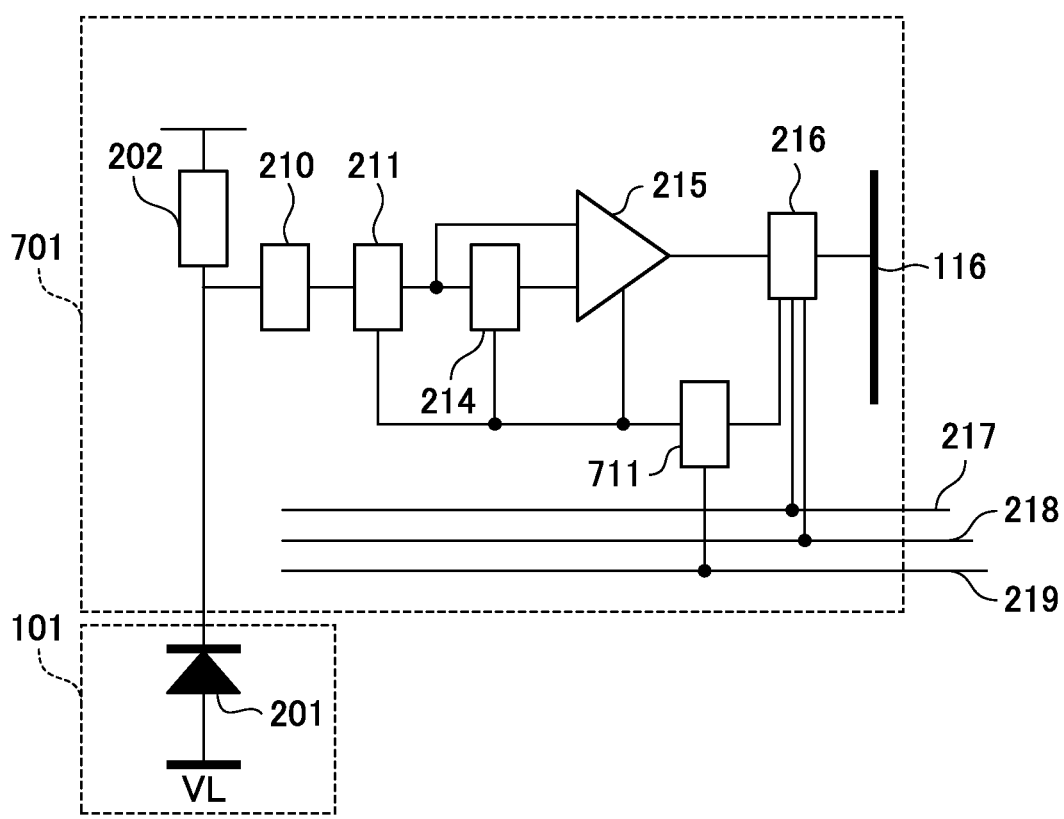
FIG. 7 is an example of the equivalent circuit and block diagram of the pixel and signal processing unit according to the first embodiment.

FIG. 7 illustrates an example of a configuration of a pixel portion according to the second embodiment. Specifically, an example of an equivalent circuit and block diagram of the pixel 101 and the signal processing unit 701 of the photoelectric conversion apparatus 100 is shown. Note that, in the second embodiment, the pixel portion is assumed to include the pixel 101 and the signal processing unit 701. Regarding the configuration of the pixel portion in the second embodiment, an explanation of the configuration that is the same the pixel portion in the first embodiment will be omitted.

The signal processing unit 701 includes the quench element 202, the waveform shaping unit 210, a first counter circuit 211, a memory 214, the comparison circuit 215, the determination circuit 216, the response line 217, the selection line 218, and the control line 219, as in the signal processing unit 103 in the first embodiment. The signal processing unit 701 in the second embodiment further has a second counter circuit 711. The configuration of the first counter circuit 211 is the same as that of the counter circuit 211 in the first embodiment.

The second counter circuit 711 is a counter circuit that measures (counts) time by using a clock inside the sensor based on a set value from the control unit 303. When the second counter circuit 711 detects that the sub-frame period set via the control line 219 has elapsed, it performs resetting of the count value and starts the next counting.

The first counter circuit 211 starts counting photons upon receiving the count start of the second counter circuit 711, and counting upon receiving the reset of the second counter circuit 711, and updates the count value M of the memory 214.

Upon receiving the count start of the second counter circuit 711, the comparison circuit 215 sets the first threshold Nth1 and the second threshold Nth2, which are event detection thresholds, based on the count value M held in the memory 214, and compares them and the count value N of the first counter circuit 211.

When the address event data is "−1" or "+1," the determination circuit 216 send a request signal to the vertical arbitration circuit 110 via the request signal output line 114VREQ. The determination circuit 216 does not send a request signal to the vertical arbitration circuit 110 if the address event data is "0".

Then, the determination circuit 216 outputs the address event data to the column circuit 112 upon receiving the response signal from the vertical arbitration circuit 110.

Figure 8:
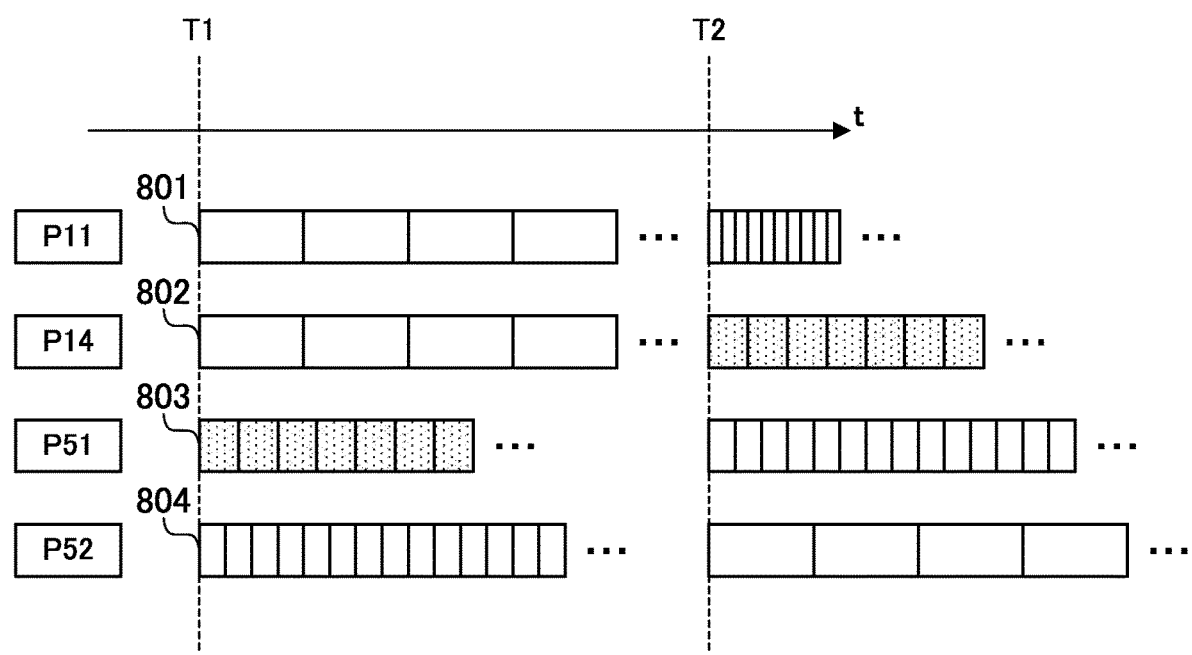
FIG. 8 is a diagram showing a timing chart that explains the driving method of the photoelectric conversion apparatus according to the second embodiment.

FIG. 8 is a schematic diagram showing the sub-frame periods set for each pixel. Specifically, the driving in which different sub-frame periods 801 to 804 are set for each pixel at time T1 and the setting of the sub-frame periods is changed at time T2 is shown.

At time T1, a pixel P11 and the pixel P14 are pixels in which an address event has not occurred, or the frequency of the occurrence is low. A pixel P51 and a pixel P52 are the pixels in which the address event has occurred, that is, the pixels in which a moving object image is projected as an object. The control unit 303 sets a short sub-frame time for a region where the address evens has occurred and sets a long sub-frame time for a pixel where events has not occurred.

The signal processing unit 701 in the second embodiment is provided with the second counter circuit 711 for time measurement for each signal processing circuit so that the time to be counted can be changed for each pixel, and a different sub-frame can be set for each pixel.

Furthermore, at time T2, an example in which a projection position of the moving object image that is the object has moved is shown, and address events occur in the pixels P11, P14, and P51.

The control unit 303 can detect the address event occurrence coordinates from the coordinate information included in the address event output and change the sub-frame period that has been set for each pixel. The configuration may be adopted in which the setting of the sub-frame period can be changed by an input from an external device to the photoelectric conversion apparatus 100. Alternatively, the configuration may be adopted in which the frequency of occurrence of address event is determined by a control unit 303 inside the photoelectric conversion apparatus 100, and the sub-frame period can be changed according to the determination state. It is possible to increase the frequency of detection of address event by setting the shorter sub-frame period short for the detected address and its neighborhood.

Figure 9B:
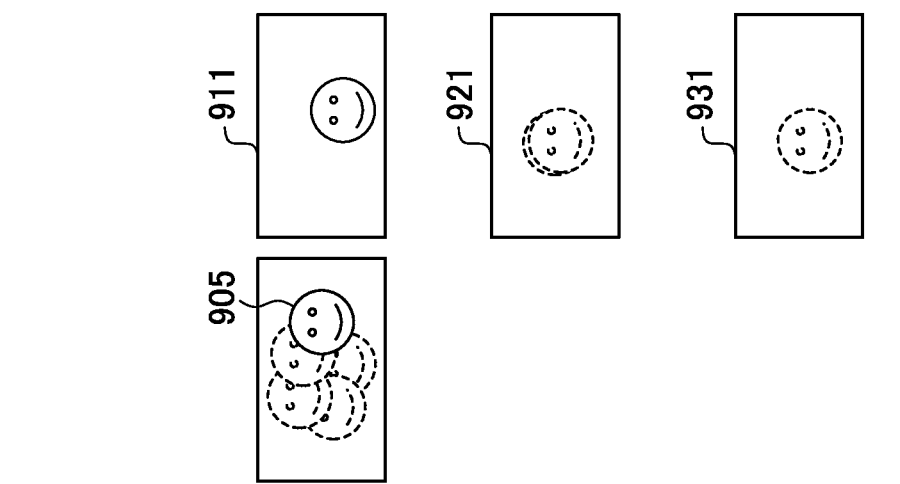
FIG. 9A and FIG. 9B are schematic diagrams showing the output data of the photoelectric conversion apparatus according to the second embodiment.
Figure 9A:
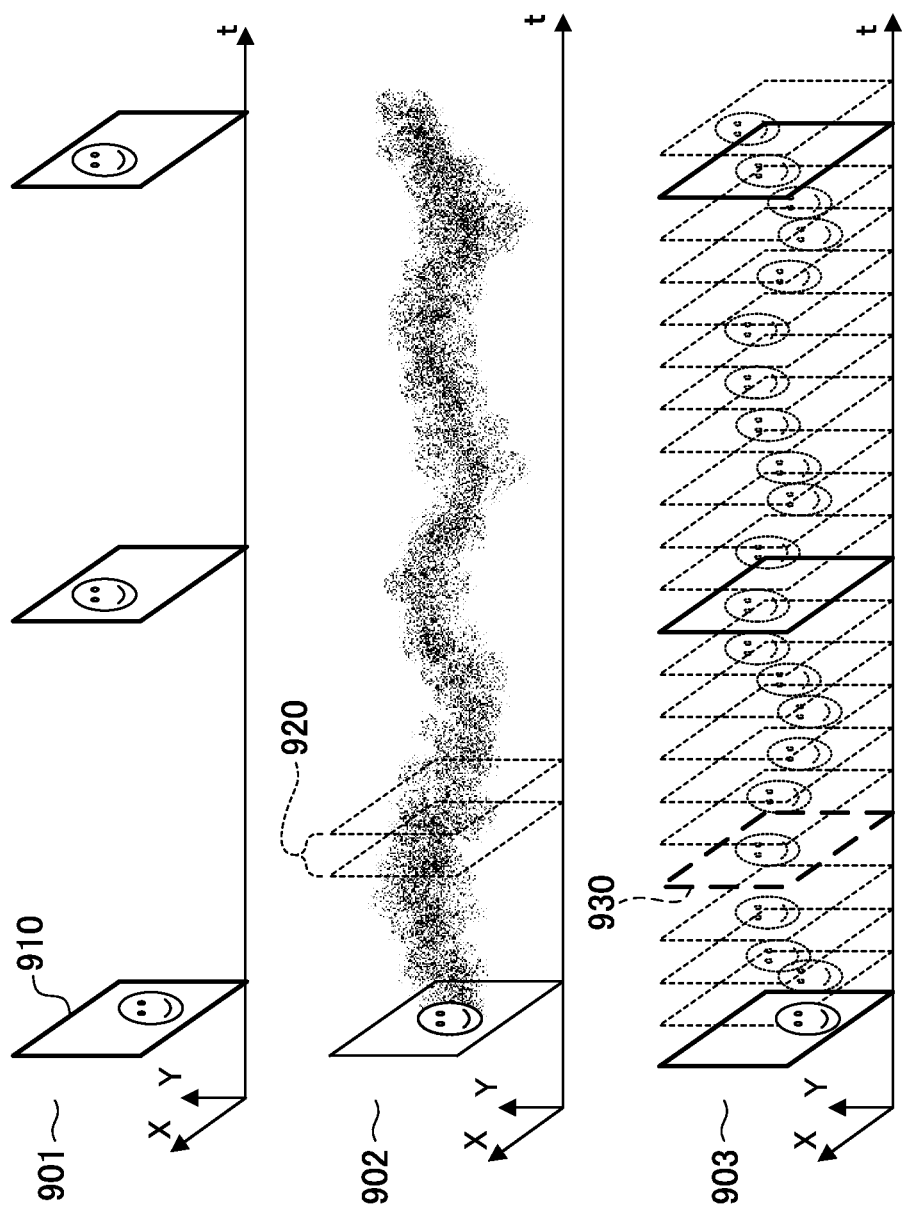

FIGS. 9A to 9C are schematic diagrams illustrating the output of address event data in the second embodiment. Output data (image-output) 901 to 903 in FIG. 9A indicate output data on a time axis. In FIG. 9, "t" on the horizontal axis indicates time (time information). FIG. 9B is a diagram showing that the output data SOUT of the photoelectric conversion apparatus 100 at a given time is plotted in a two-dimensional plane. The respective image outputs are image outputs in the motion of the same object is imaged, and a state in which an object 905 moves within the field angle at a constant cycle is shown.

The output data 901 show frame image-output of the photoelectric conversion apparatus 100, show each frame image driven, for example, at 60 fps. An image 911 indicates a frame image that has been output at the timing of image output 910.

Output data 902 shows the output data SOUT of the photoelectric conversion apparatus 100 based on the signal processing unit 701. Since different sub-frame periods are set for each pixel and data are output every time an address event occurs, the data output is asynchronous. The output data are denoted by, for example, SOUT=(x, y, E, t), and is output as the combination of the coordinate information of x and y, the event determination value E, and the time information t.

An image 921 is image data of the address event obtained by plotting event information generated during a time period 920 on a two-dimensional plane, for convenience. It is possible to set the sub-frame period shorter, for example, only for the region where event occurs by setting different sub-frame period for each pixel, and thereby increase the number of detections of an event.

In contrast, if the timing of occurrence of address event for each pixel is asynchronous, because the occurrence time of address event differs for each pixel, it is necessary to accumulate event information for a predetermined time period so that two-dimensional imaging is produced. Since the frequency of event occurrence for each pixel differs according to the state of the object, a coarse and dense region occurs on the plotted image. Additionally, the address event of the same object may appear on the plotted image as different coordinate data, depending on the relation between the occurrence timing of address event and the event detection threshold.

To take a countermeasure against this, the detection timing of address event can be aligned by setting the same sub-frame period to all the pixels. The driving at this time is shown in output data 903.

The output data 903 shows the output data SOUT of the photoelectric conversion apparatus 100 based on the signal processing unit 103 in the first embodiment. In this case, a state in which the same sub-frame period is set to all the pixels is shown. The output data SOUT is output as SOUT=(x, y, E, F) as a combination of, for example, coordinate information of x and y, the event determination value E, and the sub-frame number F.

An image 931 is image data of the address event obtained by plotting the output data SOUT at the timing of a sub-frame 930 on a two-dimensional plane. In this case, the same sub-frame period is set to all the pixels in the photoelectric conversion apparatus 100. Since the event determination value E is output for a pixel where the event has occurred, it is not output as all pixel data of the frame image. However, it is possible to align the detection timing of address events by setting the same sub-frame period for pixels.

In the photoelectric conversion apparatus 100 in the second embodiment, it is possible to reduce the processing load when conversion to the frame image is performed on the user side, without requiring processing such as rearranging the output address events according to the timing of occurrence and coordinates, by adopting the configuration as described above. Furthermore, it is possible to represent the occurrence timing by adding a sub-frame number F that indicates which sub-frame the data has occurred in. It is possible to add time information with a low amount of data, rather than adding detailed time information by representing it as a frame number.

Additionally, since the timing of event determination is synchronized, the configuration in which a request signal is sent for each pixel and the response is waited for, in the determination circuit 216 of the signal processing unit 103, does not necessarily have to be adopted. The configuration in which a vertical arbitration circuit and a horizontal arbitration circuit scan each pixel and only the output value of the pixel on which the request signal stands is read out may be adopted, as in the conventional horizontal and vertical scanning image pickup element.

Third Embodiment (Multiple Modes)

In the third embodiment, a configuration in which the photoelectric conversion apparatus 100 selects and outputs the address event data and frame images will be described below, with reference to FIG. 10.

Figure 10:
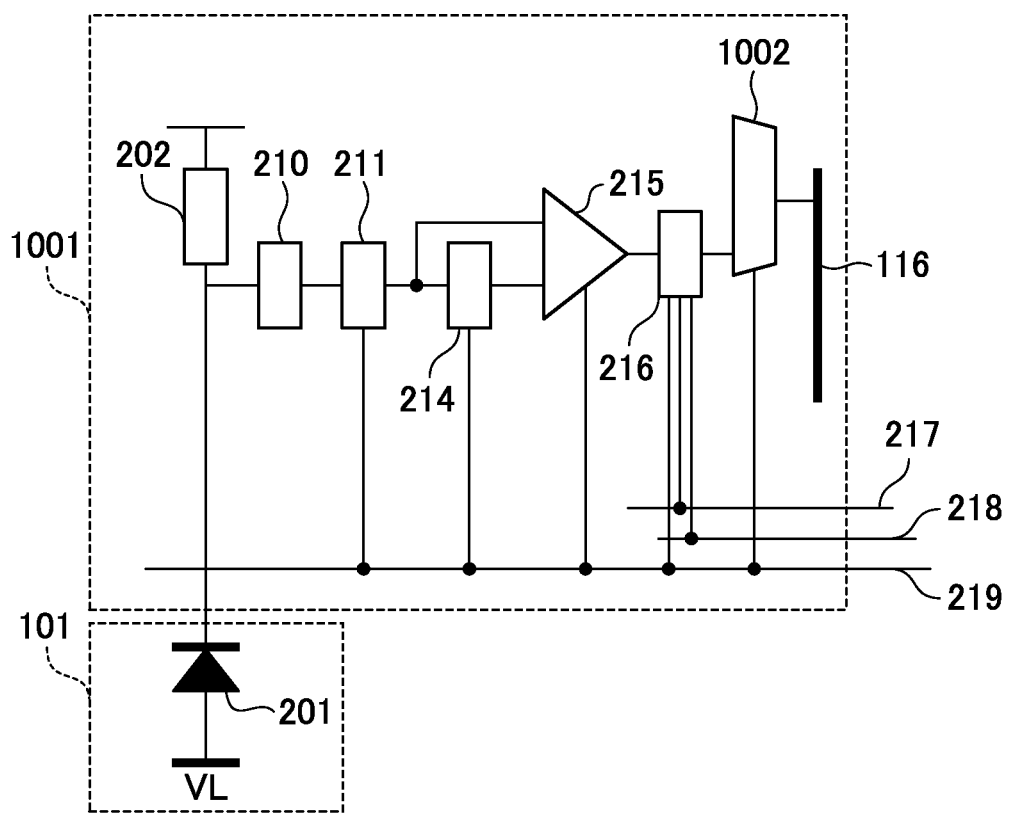
FIG. 10 is an example of the equivalent circuit and block diagram of the pixel and the signal processing unit according to the third embodiment.

FIG. 10 is a diagram illustrating an example of a configuration of a pixel portion according to the third embodiment. Specifically, an example of an equivalent circuit and block diagram of the pixel 101 and signal processing unit 1001 of the photoelectric conversion apparatus 100 is shown. Note that the pixel portion in the third embodiment is configured to include the pixel 101 and the signal processing unit 1001. In the configuration of the pixel portion in the third embodiment, an explanation of the configuration that is the same as the pixel portion in the first embodiment will be omitted.

The signal processing unit 1001 includes the quench element 202, the waveform shaping unit 210, the counter circuit 211, the memory 214, the comparison circuit 215, a determination circuit 216, the response line 217, the selection line 218, and the control line 219, as in the signal processing unit 103 in the first embodiment. The signal processing unit 1001 in the third embodiment further has a second selection circuit 1002.

The second selection circuit 1002 is a circuit that switches the output data of the signal processing unit 1001. In the second selection circuit 1002, a configuration is adopted in which the output of the memory 214 and the output of the determination circuit 216 are connected, and output signals such as the count value N, the count value M, and the address event data can be selected by the control line 219. For example, when the output of the memory 214 is selected by the second selection circuit 1002, the count value M of the pixel is output to the column circuit.

In the photoelectric conversion apparatus 100 in the third embodiment, it is possible to appropriately select the address event data and the frame image and output them, by adopting the configuration as described above.

Fourth Embodiment (Configuration to Switch to Background Difference Event)

Figure 11:
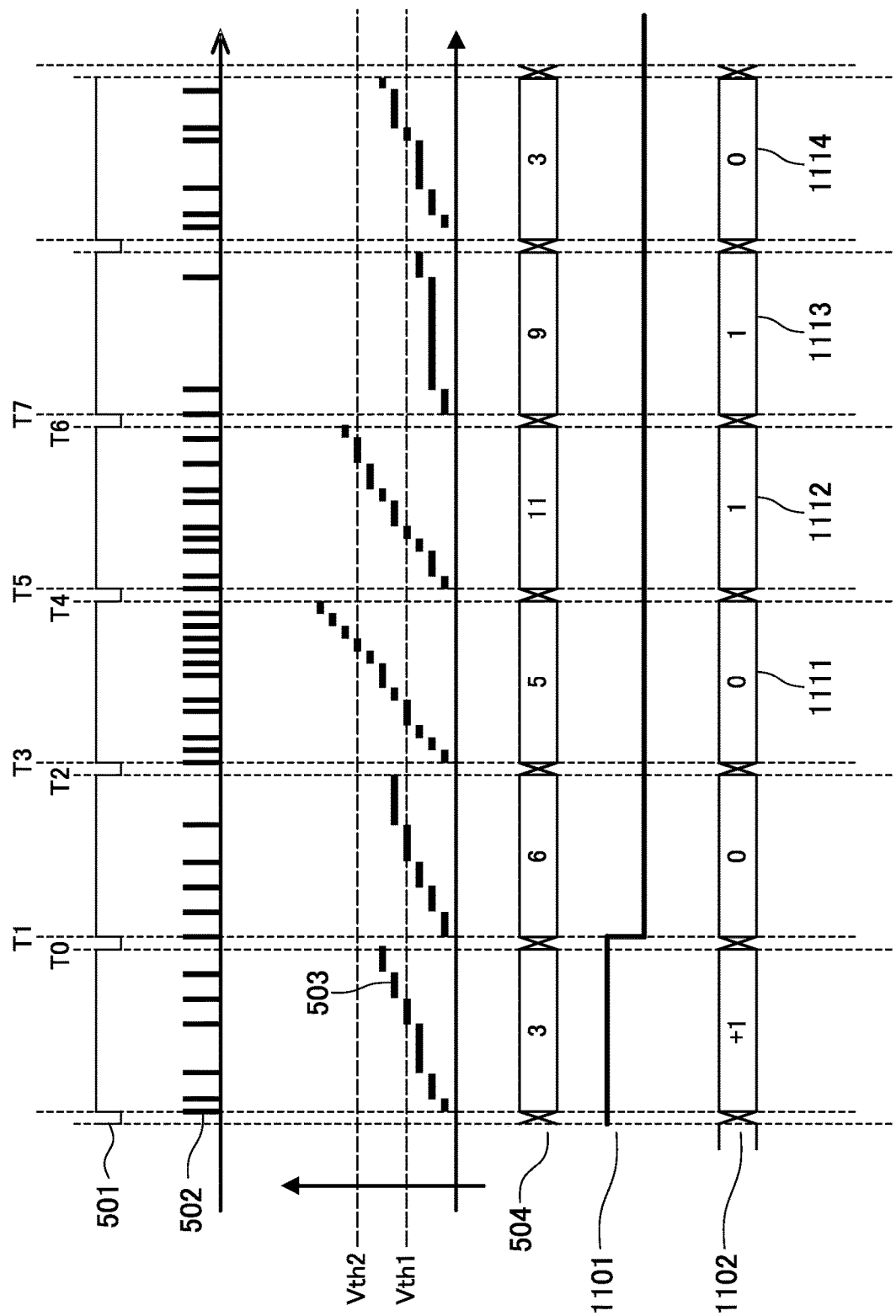
FIG. 11 is a diagram that shows a timing chart that explains the driving method of the photoelectric conversion apparatus according to the fourth embodiment.

In the fourth embodiment, a configuration in which a difference with a background image is detected as an address event in the signal processing unit 103 will be described below with reference to FIG. 11. FIG. 11 is a diagram showing a timing chart that explains the driving method of the photoelectric conversion apparatus 100 in the fourth embodiment. Note that since the configuration of the photoelectric conversion apparatus 100 in the fourth embodiment is the same as that of the photoelectric conversion apparatus 100 in the first embodiment, the explanation will be omitted.

In the signal processing unit 103 in the fourth embodiment, by transmitting a control signal, the control unit 303 is capable of selecting whether or not the count value M stored in the memory 214 of the signal processing unit 103 needs to be updated at a desired timing. The count value for comparing the occurrence of address event can be fixed by stopping the update of the count value M.

While the address event described in each of the above embodiments is the determination of sequential address event in which the (current) count value is sequentially compared to the count value last time, in the fourth embodiment, the count value of pixel at a certain time held in the memory 214 is compared to the current count value. In other words, it can be said the address event is obtained by comparing a background image at a certain point in time to an object that is moving in front thereof. The address event detection method in which comparison to the fixed image is performed and determination is made is referred to as the "background difference event" and the description will be continued. The determination result of the address event in the fourth embodiment determined as a background difference event is denoted by an "event detection value B".

The state in which the photoelectric conversion apparatus 100 in the fourth embodiment is fixed, that is, the case in which imaging by fixed-point observation is performed, is assumed. In that case, since there is a high probability that the background image is a stationary object, it becomes easy to separate the background image stored in the memory 214 from the event (object that is moving) and detect it as an address event.

Note that, in the configurations of the signal processing unit 701 in the second embodiment and the signal processing unit 1001 in the third embodiment as well, a configuration may be adopted in which the count value M is not updated by allowing the control unit 303 to select the stop of the counter circuit 211 or the stop of the update of the memory 214. This makes it possible to determine the background difference event. Furthermore, in the configuration of the signal processing unit 1001, the background image that is held in memory 214 can also be output as a frame image by selecting the count value M of the memory 214 as the output of the second selection circuit 1002.

Subsequently, the driving method when the background difference event is detected shown in FIG. 11 will be explained. In the fourth embodiment, a description of the operation of the signal processing unit 103 that duplicates that of the first embodiment will be omitted. In the fourth embodiment, the event detection threshold range is set to 4, and the captured image at the timing of time T1 is selected as the background image.

A signal 1101 is a control signal sent from the control unit 303 via the control line 219. When the signal 1101 becomes Low at the timing of time T1, the update of the memory 214 stops. Accordingly, with respect to the event detection threshold set in the comparison circuit 215 on and after the time T2, the first threshold Bth1=4 is established and fixed to the second threshold Bth2=8, and the count value M is not updated. Background difference events are performed by comparing the count value N with the first threshold Bth1 and the second threshold Bth2, as in the address events.

A signal 1102 is the event detection value B determined by the determination circuit 216. When the count value N input to the comparison circuit 215 satisfies first threshold value Bth1<count value N<second threshold value Bth2, the event detection value B outputs 0. If count value N<first threshold Bth1 or second threshold Bth2<count value N is satisfied, 1 or −1 is output. Alternatively, a configuration in which switching is performed with binary values, in which positive and negative signs are not used and 0 is output when a change is not detected and 1 is output when a change is detected may be adopted. In this context, signals 1111 to 1114 become the event detection value B of the background difference event.

Note that the control unit 303 can also change the event detection threshold range in a state in which the update of the memory 214 has stopped.

In the case of determining the background difference event, if the count value M held in the memory 214 and the image capturing condition are different, the determination of the address event becomes difficult. For this reason, for example, the control unit 303 is configured in such a manner that the count value is multiplied by a coefficient with a ratio of different sub-frame period and compare them by the comparison circuit 215.

In the photoelectric conversion apparatus 100 in the fourth embodiment, the difference with the background image can be appropriately detected as an address event by adopting the above configuration as described above.

Fifth Embodiment

Figure 12:
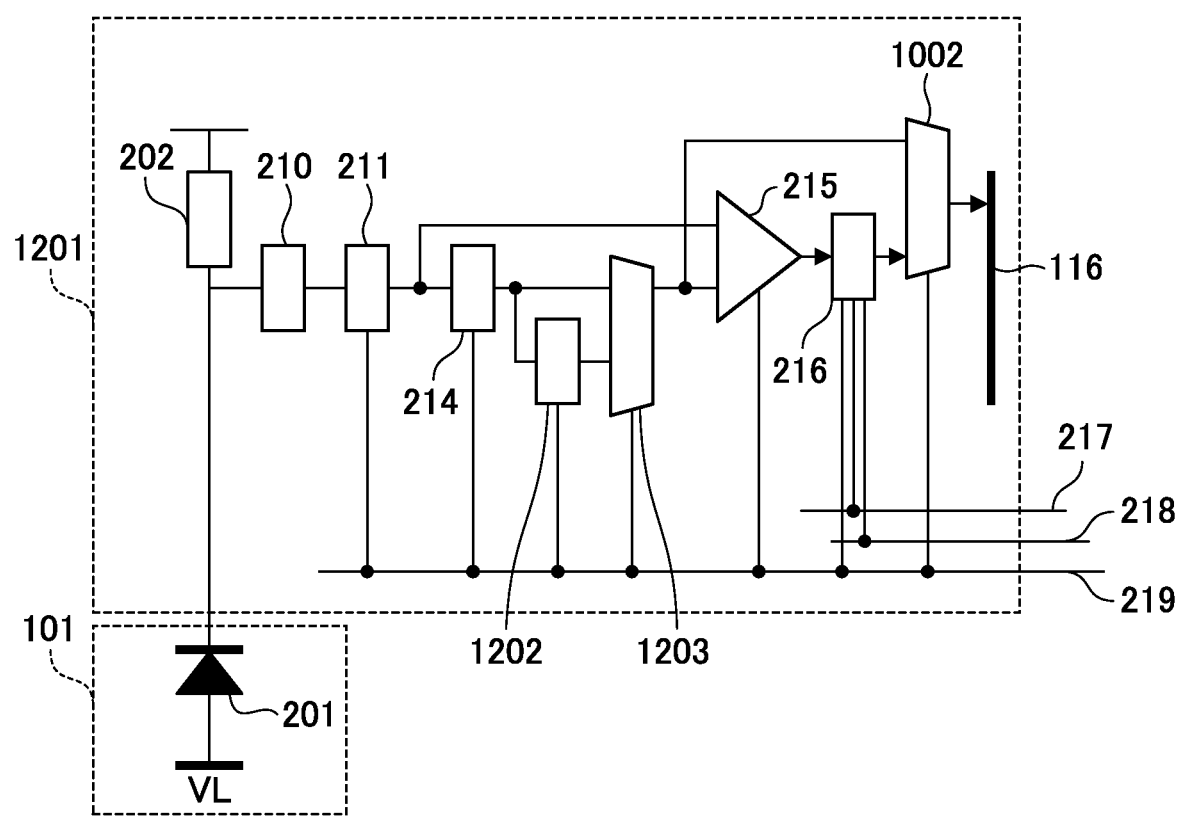
FIG. 12 is an example of the equivalent circuit and block diagram of the pixel and the signal processing unit according to the fifth embodiment.

The photoelectric conversion apparatus 100 in the fifth embodiment will be described below with reference to FIGS. 12 to 14. FIG. 12 illustrates an example of a configuration of a pixel portion according to the fifth embodiment. Specifically, an example of the equivalent circuit and the block diagram of the pixel 101 and a signal processing unit 1201 of the photoelectric conversion apparatus 100 is shown. Note that, in the fifth embodiment, it is assumed that the pixel portion includes the pixel 101 and the signal processing unit 1201. Regarding the configuration of the pixel portion in the fifth embodiment, an explanation of the configuration that is the same the pixel portion in the first embodiment and the third embodiment will be omitted.

The signal processing unit 1201 of the photoelectric conversion apparatus 100 in the fifth embodiment is configured to enable outputting while appropriately switching the frame image output, address event output, and background difference event output by adding a second memory 1202.

The signal processing unit 1201 includes the quench element 202, the waveform shaping unit 210, the counter circuit 211, a first memory 214, the comparison circuit 215, a determination circuit 216, the response line 217, the selection line 218, the control line 219, and the second selection circuit 1002. The signal processing unit 1201 further has the second memory 1202 and a third selection circuit 1203. Note that the first memory 214 has the same configuration as the memory 214 in the first embodiment.

The second memory 1202 is connected to the first memory 214. The third selection circuit 1203 switches the memories connected to the comparison circuit 215.

The signal processing unit 1201 stores the count value N (first count value) counted by the counter circuit 211 in the first memory 214, as the count value M (second count value) for each of the sub-frame periods that have been set, based on the control signal from the control unit 303. Additionally, the signal processing unit 1201 can store the count value N, as the count value M (third count value), in the second memory 1202 at an arbitrary timing. Note that, although the count value N may be held in the second memory 1202 at any timing as described above, it may be held, for example, in conjunction with the timing of holding the count value N in the first memory 214.

The comparison circuit 215 compares the count value N with either or both the first threshold Nth1 and the second threshold Nth2, which are thresholds based on the first memory 214, and the first threshold Bth1 and the second threshold Bth2, which are thresholds based on the second memory 1202. The comparison circuit 215 in the fifth embodiment is configured to enable selecting which of the thresholds described above is compared with the count value N based on the control signal from the control unit 303.

The determination circuit 216 determines the output signal of the comparison circuit 215 and determines the event detection value B.

A configuration is adopted in which the output signal of the third selection circuit 1203 and the output signal of the determination circuit 216 are connected to the second selection circuit 1002 and the output data to the column circuit 212 can be switched based on the control signal from the control unit 303.

For example, when the frame image output is selected, the output data SOUT of the photoelectric conversion apparatus 100 becomes the frame image output of SOUT=Y (R, G, B). Additionally, a configuration in which SOUT=(x, y, E, F) is output when the address event output and the background difference event output are selected may be adopted. Alternatively, a configuration may be adopted in which the address event output and the background difference event output are output simultaneously as SOUT=(x, y, E, B, F), instead of only SOUT=(x, y, B, F).

In the photoelectric conversion apparatus 100 in the fifth embodiment, the frame image output, the address event output, and the background difference event output can be appropriately switched, by adopting the configuration as described above.

Figure 13:
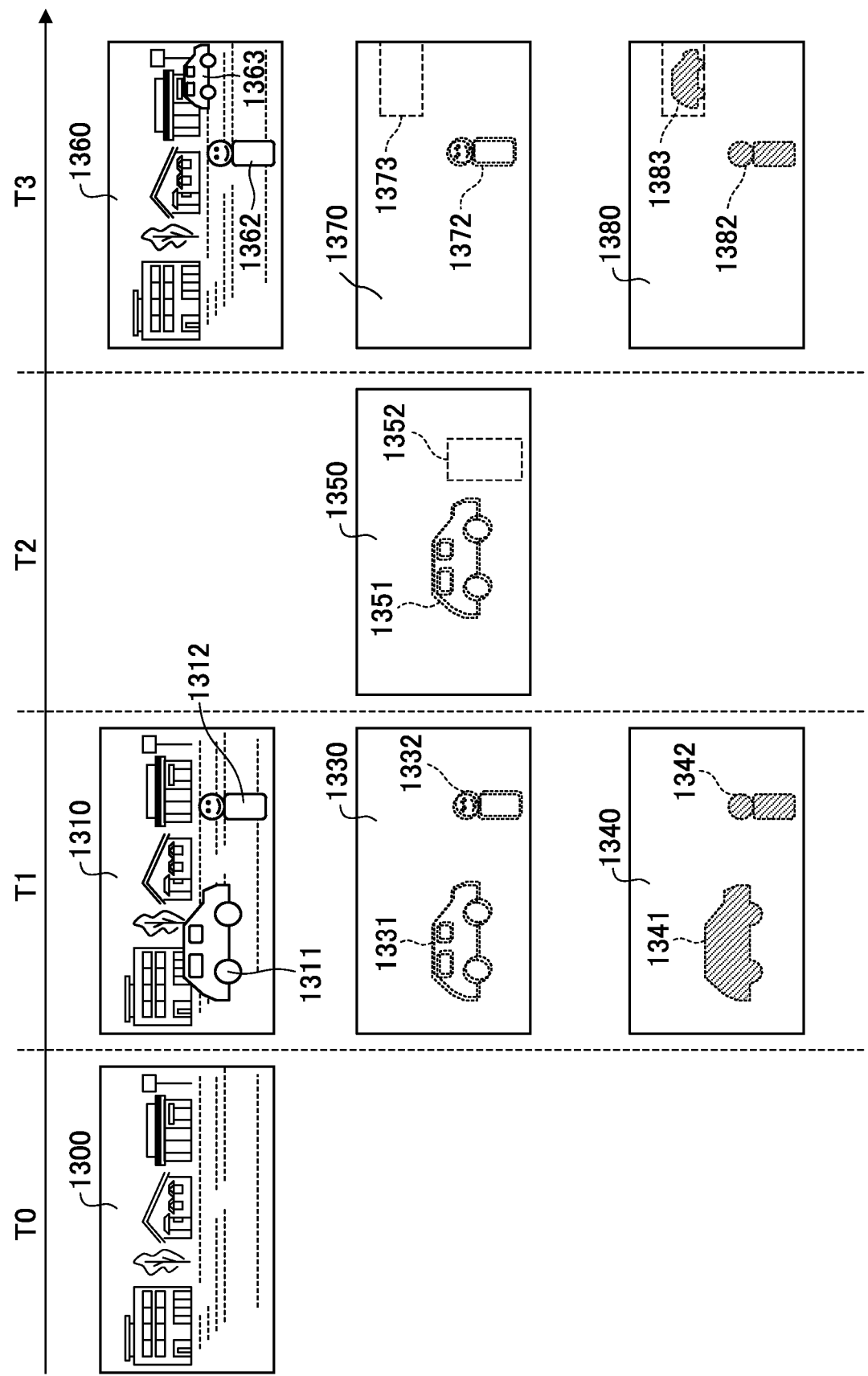
FIG. 13 is a schematic diagram showing the output data of the photoelectric conversion apparatus according to the fifth embodiment.

FIG. 13 is a schematic diagram showing image data output from the photoelectric conversion apparatus 100. Specifically, the captured image at time T0 is shown. In this case, the count value N of the counter circuit 211 at time T 0 is held (stored) as the count value M in the second memory 1202 to serve as a count value for detecting a background difference event.

An image 1300 is event image data obtained by plotting the output data of the signal processing unit 1001 or the signal processing unit 1201 on a two-dimensional plane. The photoelectric conversion apparatus 100 captures an image of an object in a fixed position, and the change of the object within the field angle at a certain time T1 to T4 is shown.

An image 1310 shows the state of the object at time T1. In the image 1310, an object 1311 that moves relatively fast and an object 1312 that moves slower than the object 1311 exist within the field angle.

An image 1330 is an image obtained by plotting the address event data at time T1 on a two-dimensional plane. In the image 1330, the period SF1 is set as the sub-frame time-period, and address event data 1331 that corresponds to the object 1311 and address event data 1332 that corresponds to the object 1312 can be detected.

An image 1340 is an image obtained by plotting the background difference event data at time T1 on a two-dimensional plane. In the image 1340, the same period SF1 is set as the sub-frame period, and address event data 1341 that corresponds to the object 1311 and address event data 1342 that corresponds to the object 1312 can be detected. If the luminance level change is within a predetermined range, that is, the luminance level change falls between the first threshold Bth1 and the second threshold Bth2 that are event detection thresholds as the result for comparing the image 1300 and the image 1310, the luminance level change is not detected as an address event. That is, the stationary background is not detected.

An image 1350 shows the state of the object at time T2. The image 1350 shows a state in which the sub-frame period is changed to SF2, which is shorter than the period SF1. In this state, although address event data 1351 that corresponds to the object 1311 is detected, address event data that corresponds to the object 1312 that moves slow is not detected in a region 1352. In such a case, it is possible to detect the object 1312 again by reducing the event detection threshold range by the control unit 303. Alternatively, the same effect can be obtained by returning the setting of the sub-frame period to the long period SF1 and increasing the count value N of photons per unit time.

An image 1360 shows the state of the object at time T3. An object 1362 shows a manner in which the object 1312 is moving. An object 1363 shows a stationary object, for example, parked on the street and the like.

An image 1370 is an image obtained by plotting the address event data at time T3 on a two-dimensional plane. In the image 1370, the period SF1 is set as the sub-frame period, and only address event data 1372 that corresponds to the object 1362 is detected.

An image 1380 is an image obtained by plotting the background difference event data at time T3 on a two-dimensional plane. In the image 1380, the same period SF1 is set as the sub-frame period, and both address event data 1382 that corresponds to the object 1362 and address event data 1383 that corresponds to the object 1363 can be detected.

Thus, it is possible to detect the object that has stopped temporarily by comparing to the background difference event data, in addition to detecting the address events, by using the photoelectric conversion apparatus 100 in the fifth embodiment. Additionally, the comparison at two different times facilitates the detection of objects that are moving at different speeds.

Note that a configuration in which the count value M held in the second memory 1202 is updated periodically or at predetermined intervals may be adopted. For example, it is also possible to detect only an object that moves faster than a prescribed speed by updating the second memory at a period later than the first memory 214 and comparing the address event data and the background difference event data.

Figure 14:
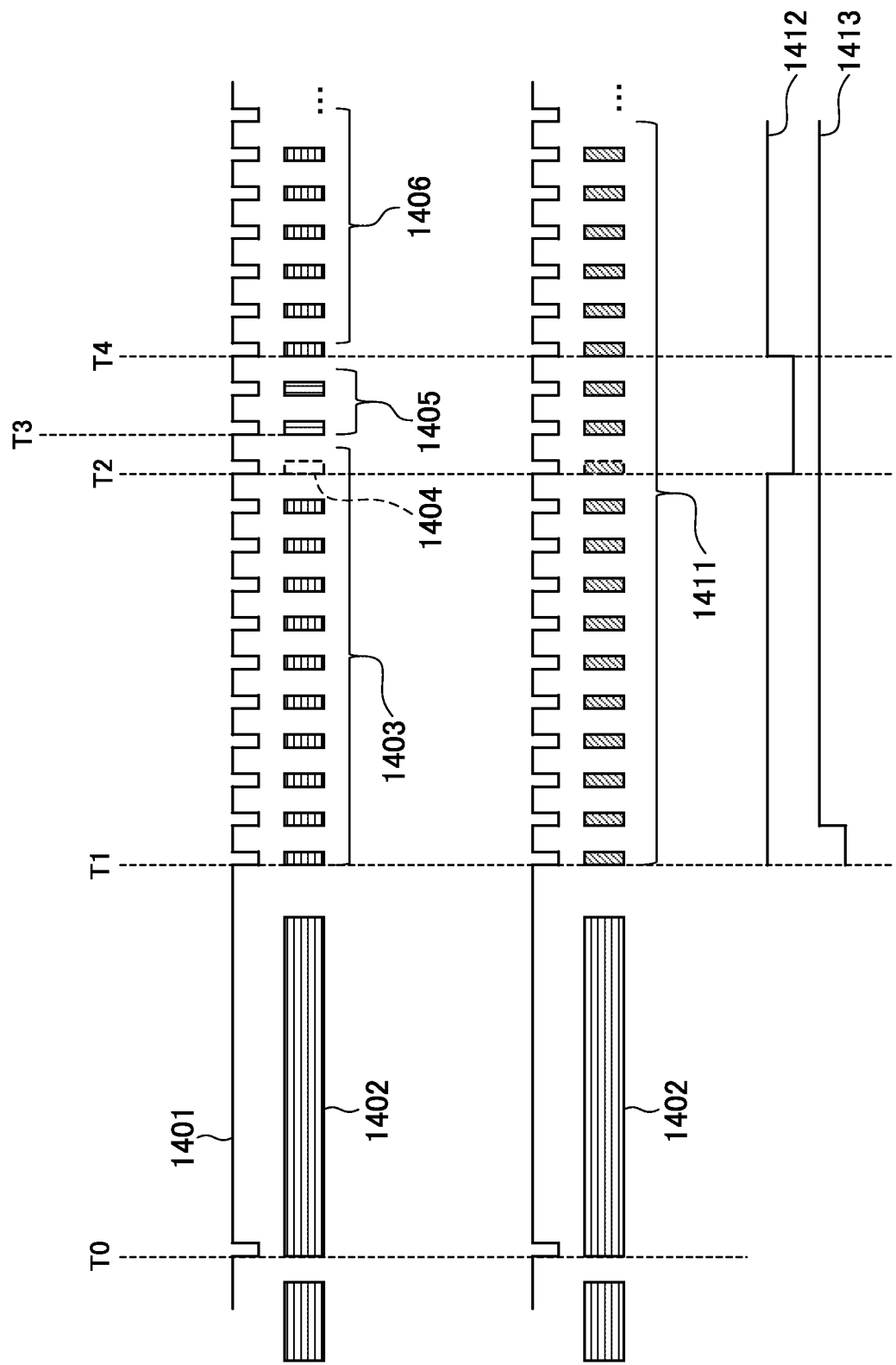
FIG. 14 is a diagram showing a timing chart that explains the driving method of the photoelectric conversion apparatus according to the fifth embodiment.

FIG. 14 is a diagram showing a timing chart that explains the driving method of the photoelectric conversion apparatus 100 according to the fifth embodiment. Specifically, FIG. 14 is a diagram that shows the operation of switching image capture modes according to the output of captured image.

A signal 1401 is a control signal indicating the image capturing cycle (frame rate). Signals 1402 to 1406 are signals that indicate the output data SOUT of the photoelectric conversion apparatus 100 that is provided with the signal processing unit 1201. Timing 1410 outputs frame image data.

When the control unit 303 of the photoelectric conversion apparatus 100 in the fifth embodiment detects the movement of the object based on the frame image data of the output signal SOUT1=(R, G, B), it stores the background image in the second memory 1202 at time T1 and switches the control to the address event output. Output data 1403 indicates address event output SOUT2=(x, y, E, F) detected in each of the sub-frame periods.

When the object stops at time T2, the address event is not output as shown in a signal output 1404.

When the control unit 303 determines that the occurrence of address event has stopped, it switches the third selection circuit 1203 to switch to the output SOUT3=(x, y, B, F) of the background difference event at time T3.

This results in detecting pixels that have changed within the field angle from the point in time of T1 at which updating of the second memory 1202 has stopped. Since the event detection value B=1 of the background difference event can be detected with respect to pixels in the same region, the control unit 303 determines that the object that causes the address event continues to exist.

When the control unit 303 detects that the pixel region where the background difference event occurs has changed, it determines that the object has moved again and switches to the address event output SOUT2 again at time T4.

As described above, the configuration in which the image capture mode can be changed in response to the movement of the object is adopted. Switching the image capture modes according to the moving speed of the object facilitates tracking the moving object.

The movement and stopping of the object can be handled also by adopting the configuration of the signal processing section 1201 and simultaneously detecting the address event output and the background difference event. A signal 1411 in FIG. 14 indicates the driving when output data SOUT 4=(x, y, E, B, F) is output. A signal 1412 indicates the event detection value E. A signal 1413 indicates the event detection value B.

Background information is stored in the second memory 1202 at the timing of time T1, and a background difference event is detected. The comparison of the first threshold Nth1 and the first threshold Bth1 and the second threshold Nth2 and the second threshold Bth2 are simultaneously performed by the third selection circuit 1203 and the comparison circuit 215. The determination circuit 216 in the fifth embodiment is configured to enable simultaneously detecting two types of events that occur at an arbitrary pixel.

Although when the object to be imaged stops at time T2 shown in FIG. 14, event detection value E=0 is established, the position of the object has changed since time T1, event detection value E=1 can be detected for the same pixel (coordinate). Consequently, the situation of losing the object from view is eliminated. Furthermore, in the output data SOUT4, only one bit is increased as the event detection value B, and the amount of output data can be suppressed.

As described above, in the photoelectric conversion apparatus 100 in the fifth embodiment, address events with higher accuracy can be detected by simultaneously outputting a plurality of event detection values. Therefore, the address events continue to occur even when the object repeatedly moves and stops, and the situation of losing the object from view is eliminated.

The present invention can also be achieved in a process in which a program that realizes one or more functions of the above embodiment is supplied to a system or device via a network or storage medium, and one or more processors in a computer of the system or the device read and execute the program. Additionally, the present invention can also be achieved by a circuit (for example, an ASIC) that achieves one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-021226, Feb. 15, 2022, which is hereby incorporated by reference wherein in its entirety.

What is claimed is:

1. A photoelectric conversion apparatus comprising:
a photoelectric conversion element that outputs a signal in response to an incidence of a photon;
a counter circuit that counts the number of the signal output from the photoelectric conversion element during a predetermined time period and outputs the number of the signal as a first count value;
a memory that stores the number of a signal output from the counter circuit before the predetermined time period as a second count value; and
a comparison circuit that sets a threshold based on the second count value and compares the first count value to the threshold,
wherein a luminance change of the photoelectric conversion element is detected based on a comparison result by the comparison circuit.

2. The photoelectric conversion apparatus according to claim 1, wherein the threshold comprises a first threshold lower than the first count value and a second threshold greater than the second count value.

3. The photoelectric conversion apparatus according to claim 2, wherein the luminance change is not detected if the first count value is greater than or equal to the first threshold and less than the second threshold.

4. The photoelectric conversion apparatus according to claim 2, wherein the luminance change is detected if the first count value is less than the first threshold and less than the second threshold or is greater than or equal to the first threshold and greater than or equal to the second threshold.

5. The photoelectric conversion apparatus according to claim 2, further comprising one or more processors executing instructions that, when executed by the one or more processors, cause the one or more processors to enable changing the first threshold and the second threshold.

6. The photoelectric conversion apparatus according to claim 5, wherein the predetermined time period can be changed.

7. The photoelectric conversion apparatus according to claim 5, wherein at least one of a cycle or timing at which the counter circuit counts the number of the signal output from the photoelectric conversion element can be changed.

8. The photoelectric conversion apparatus according to claim 1, wherein at least one of the first count value and the comparison result can be output.

9. The photoelectric conversion apparatus according to claim 1, wherein at least one of the second count value and the comparison result can be output.

10. The photoelectric conversion apparatus according to claim 1, wherein the second count value can be selected to be updated or not.

11. The photoelectric conversion apparatus according to claim 1, wherein the second count value can be updated by stopping the counter circuit.

12. The photoelectric conversion apparatus according to claim 1, wherein the photoelectric conversion element is configured by an avalanche photodiode.

13. A control method of a photoelectric conversion apparatus comprising:
counting the number of the signal from a photoelectric conversion element during a predetermined time period by a counter circuit in a photoelectric conversion element that outputs a signal in response to an incidence of a photon;
storing the number of a signal output from the counter circuit before the predetermined time period as a second count value in a memory; and
setting a threshold based on the second count value and comparing the first count value to the threshold,
wherein a luminance change of the photoelectric conversion element is detected based on a comparison result by the comparison circuit.

14. A non-transitory computer-readable storage medium storing a program for causing a computer to execute a control method of a photoelectric conversion apparatus comprising:
counting the number of the signal from a photoelectric conversion element during a predetermined time period by a counter circuit in a photoelectric conversion element that outputs a signal in response to an incidence of a photon;
storing the number of a signal output from the counter circuit before the predetermined time period as a second count value in a memory; and
setting a threshold based on the second count value and comparing the first count value to the threshold,
wherein a luminance change of the photoelectric conversion element is detected based on a comparison result by the comparison circuit.

15. An image capturing apparatus comprising:
an image formation optical system;
a photoelectric conversion element that outputs a signal in response to an incidence of a photon;
a counter circuit that counts the number of the signal output from the photoelectric conversion element during a predetermined time period and outputs the number of the signal as a first count value;
a memory that stores the number of a signal output from the counter circuit before the predetermined time period as a second count value; and
a comparison circuit that sets a threshold based on the second count value and compares the first count value to the threshold,
wherein a luminance change of the photoelectric conversion element is detected based on a comparison result by the comparison circuit.

* * * * *